United States Patent [19]

Hartmann

[11] Patent Number: 5,336,628
[45] Date of Patent: Aug. 9, 1994

[54] METHOD FOR FABRICATING SEMICONDUCTOR MEMORY DEVICE

[75] Inventor: Joel Hartmann, Claix, France

[73] Assignee: Commissariat a l'Energie Atomique, Paris, France

[21] Appl. No.: 47,161

[22] Filed: Apr. 13, 1993

Related U.S. Application Data

[63] Continuation of Ser. No. 726,965, Jul. 8, 1991, abandoned, which is a continuation-in-part of Ser. No. 425,825, Oct. 23, 1989, abandoned.

[30] Foreign Application Priority Data

Oct. 25, 1988 [FR] France .......................... 88 13934

[51] Int. Cl.$^5$ .................................... H01L 21/28
[52] U.S. Cl. .............................. 437/43; 437/48; 437/52; 437/984
[58] Field of Search .............. 437/43, 418, 52, 984; 148/DIG. 109

[56] References Cited

U.S. PATENT DOCUMENTS

| | | | |
|---|---|---|---|
| 4,707,717 | 11/1987 | Hirabayashi et al. | 357/23.5 |
| 4,768,080 | 8/1988 | Sato | 357/23.5 |
| 4,851,365 | 7/1989 | Jeuch et al. | 437/48 |
| 4,935,380 | 6/1990 | Okumura | 437/43 |
| 5,107,313 | 4/1992 | Kohda et al. | 357/23.5 |

FOREIGN PATENT DOCUMENTS

| | | | |
|---|---|---|---|
| 0160965 | 11/1985 | European Pat. Off. | 357/23.5 |
| 56-94778 | 7/1981 | Japan | 357/23.5 |
| 61-99377 | 5/1986 | Japan | 357/23.5 |

*Primary Examiner*—George Fourson
*Attorney, Agent, or Firm*—Hayes, Soloway, Hennessey, Grossman & Hage

[57] ABSTRACT

An improved integrated circuit and fabrication method for forming the improved integrated circuit is described. The method includes an anisotropic etching, without the use of either masks or photolithography, which removes insulating material from contact openings, but keeps insulating material on the sides of conductive layers, preventing inadvertent short circuits from the contact openings to the conductive layers. The maskless etching method makes it possible to avoid mask-wafer alignment errors and therefore frees designers to perfectly center contact openings within insulative regions without taking into account the surface area tolerances required under prior art fabrication methods. This freedom allows designers to design more highly integrated devices. The particular embodiments of the semiconductor integrated circuit may include floating gates (47) and control gates (52) covered with an upper oxide layer (53) on which electrical connection lines (11) have been installed.

8 Claims, 7 Drawing Sheets

METHOD FOR FABRICATING SEMICONDUCTOR MEMORY DEVICE

This is a continuation of copending application Ser. No. 07/726,965 filed on Jul. 8, 1991, now abandoned, which is a continuation-in-part of application Ser. No. 07/425,825 filed on Oct. 23, 1989, now abandoned.

FIELD OF THE INVENTION

This invention is related to the field of semiconductor integrated circuit fabrication. More specifically, this invention relates to the field of high density semiconductor integrated circuit read only memory device fabrication.

BACKGROUND OF THE INVENTION

The start of a typical method to obtain an EPROM memory eventually results in the product shown on FIG. 1A (sectional view) and shown on FIG. 1B (top view). By means of a thermal oxidation, insulating zones of field oxide (2) are made to increase over the upper surface of a silicon substrate (1) according to the LOCOS method. The insulating zones (2) have a variable thickness which reduces at their extremities and increases both inside and outside the substrate (1) so that the upper face of the substrate (1) loses its evenness, the parts between the insulating zones 2 being recessed. Then successively formed are a lower insulating oxide layer (3), for example, by thermal growth of the substrate, and a conductive layer of the polycrystalline silicon so as to constitute the floating gates. After these layers have been formed, the polycrystalline silicon layer is etched by photolithography techniques so as to embody openings in this layer above the insulating zones (2). An intermediate insulating oxide layer (5) is then deposited above the etched polycrystalline silicon layer (4) and on its flanks, then a second polycrystalline silicon layer (6), designed to compose the control gates, is deposited on the unit.

The following stages consist of etching by photolithographic techniques the unit formed by the layers 6, 5, and 4 along strips parallel to the cutting plane of FIG. 1A as far as layer 3. The regions of sources (7) and drains (9) are established at the etched locations. Then an upper oxide layer is deposited and subjected to a thermal flow and then to an etching by photolithographic techniques so as to embody contact openings (8) on the sources and drains (the layer 3 being etched during this etching). The lines of connections to the sources and drains (feed lines and lines of binary elements) are then installed on the upper oxide layer. As the upper oxide layer is deposited on a contorted surface, it is thus unable to any longer comprise a flat upper surface, even after the plastic flow, which complicates the installing of the electrical connection lines and renders this extremely difficult if the relief irregularities are too numerous, in other words, if the memory points of the memory are too close to each other. In addition, photolithography cannot be effected with perfect alignment; it is thus essential to take account of alignment defects or centerings by increasing the distance between the contact opening zones (8) and the surrounding conductive layers 4 and 6, or, in other words, by spacing the strips of the control gates, by locally deflecting them (as shown on FIG. 1B) so as to have pass at a distance the contact opening zones (8), or by foreshortening them at these locations. The documents DE-A1- 35 42 939, EP-A2-0 182 198 and EP-A2-0 024 735 form part of this prior art. As a result from such dispositions, the integration density of memory points is rather small (the second and third documents respectively indicate, as an example, surfaces of 25 micrometers square and 18.5 micrometers by 13.5 micro-meters for each memory point.

U.S. Pat. No. 4,597,060 describes another type of EPROM memory in which the number of lines of electrical connections is especially reduced at the top of the circuit, having regard to the fact that the lines of binary elements coincide with the drains and the feed lines coincide with the sources. In this conception, there are no field oxide insulating zones on the substrate: the entire surface of each floating gate is above the conductive sections of the substrate. As a result, the ratio of the total capacity of a memory point is smaller for an interface surface between a given control gate and floating gate, which adversely affects the programming properties of the memory. Furthermore due to the fact that each drain is in contact with two rows of memory points, the stray currents are more considerable. Furthermore, this patent teaches a method of improving the planarization of semiconductor memory devices. It does not instruct one skilled in the Art, however, in any means of preventing the inadvertent electrical coupling of semiconductor memory conducting layers with contact openings.

Many processes are currently available in the art of semiconductor memory device manufacture to make contacts to substrate doped regions (e.g. source and drain contact openings) efficiently. For example, U.S. Pat. No. 4,507,853 describes a process in which semiconductor metallization patterns are deposited in such a manner as to avoid thinning at device steps and contact openings, resulting in lower contact opening-interconnection resistances and improved signal transmission. However, this patent does not teach a means of preventing inadvertent contact opening-conducting layer bonding during a metallization step; the patent does not even address itself to that concern.

Furthermore, U.S. Pat. No. 4,641,420 teaches a process involving overlaying a dielectric layer with a "smoothing" material, anisotropically etching this smoothing layer to remove it from all parts of the device except the sidewalls of the contact opening. A conducting material is then deposited over the surface of the device to make subsequent connections to the contact opening easier. This patent in no way solves the prior art's conductive layer-contact opening bonding problem. Moreover, the device under consideration in this prior art has no conductive layers within the device, but rather only has one conducting layer—the one in contact with the contact opening.

U.S. Pat. No. 4,707,717 details a method for fabricating a semiconductor memory device. However, it does not address itself to the problem presented above nor present an anisotropic engraving method to solve it. Furthermore, this prior art teaches a fabrication method in which etching is performed by photolithography. As stated previously, alignment of the photoresist used in photolithography is subject to errors which can result in serious device performance degradation. The present invention, therefore, teaches a process which is foreign to this prior art.

In the prior art, therefore, there is no disclosed method using anisotropic etching to prevent unintentional short circuiting of contact openings to one or more conducting layers, during metallization. Furthermore, any technique utilizing photolithography or masks runs the risk of photoresist or mask misalignment with the hazards inherent in such misalignment. The primary hazards of such misalignment are that either important device features will be etched inadvertently (possibly resulting in a defective device) or that large amounts of device surface area must be devoted to featureless regions surrounding contact openings (making further integration more difficult). This invention solves the problem in the prior art of contact opening-conducting layer short circuits without running the risk of either inadvertent etching of important device features though photoresist or mask misalignment or of wasting precious device surface area by forcing the prudent designer into allocating more device surface area than is necessary.

SUMMARY OF THE INVENTION

Briefly, in accordance with one of the embodiments of the invention, first, active areas of the device are delimited by forming insulative regions on the surface of the device by thermal oxidation (it should be noted that these insulative regions may be made of a tunnel oxide, whereby to form so-called tunnel functions). These insulative regions then are patterned so as to form the device's first insulating layer. A conductive layer is deposited over this first insulating layer. A second insulating layer is deposited on top of the conducting layer. The second insulating layer and the conductive layer are etched so as to create conductive strips, the gates of the device, separated by notches where conductive material had been. These removed portions define initial openings to the active areas. They are created in contact openings by applying a mask to the surface of the device, etching down to the substrate those areas which were not covered by the mask (thus forming initial contact openings), and then creating source and drain regions in these active areas, aligned with the initial contact openings, by for example, implanting arsenic ions at the bottom of these openings. A third insulating layer is deposited over the surface of the device. The third insulating layer next is etched in accordance with the present invention, by using anisotropic plasma etching, without masks, of the upper insulating layer. This anisotropic etching completely removes the third insulating layer's insulating material from the center of the bottom of the contact openings while partially removing the insulating material from the sidewalls and the surface of the device. The device then is subjected to metallization by prior art methods and this metallization serves to make electrical contact with certain sources and drains. The invention thus allows the third insulating layer partially to remain on the sidewalls of the contact openings, removing the risk of undesired contact opening-conducting layer short circuits, while totally removing the insulating layer from a central portion of the bottom of the contact openings, facilitating good electrical connections to the sources and drains.

In another embodiment of the present invention, the active regions are delimited and the first insulating layer is formed as above-described. A lower conductive layer is deposited on top of this first insulating layer. The lower conductive layer is etched so as to form floating gates. An intermediate insulating layer is deposited on top of the etched lower conductive layer. Another conductive layer is deposited on top of the intermediate insulating layer. This second conducting layer is etched along with the other two layers of the device, forming the control gates of the device. Source and drain regions are embodied. Contact openings are created by etching the device down to the sources and drains. An upper insulating layer is deposited on the surface of the device. The device is then anisotropically etched so as to remove the upper insulating layer from the bottom of the contact openings without totally removing the upper insulating layer from the sidewalls of the contact openings of the device. Metallization next takes place in accord with the process above-described.

Other objects, features and advantages of the present invention will become apparent from the following detailed description of preferred embodiments of the invention taken in conjunction with the accompanying drawings in which like numerals depict like parts, and wherein:

DETAILED DESCRIPTION OF THE INVENTION

Figure 2:
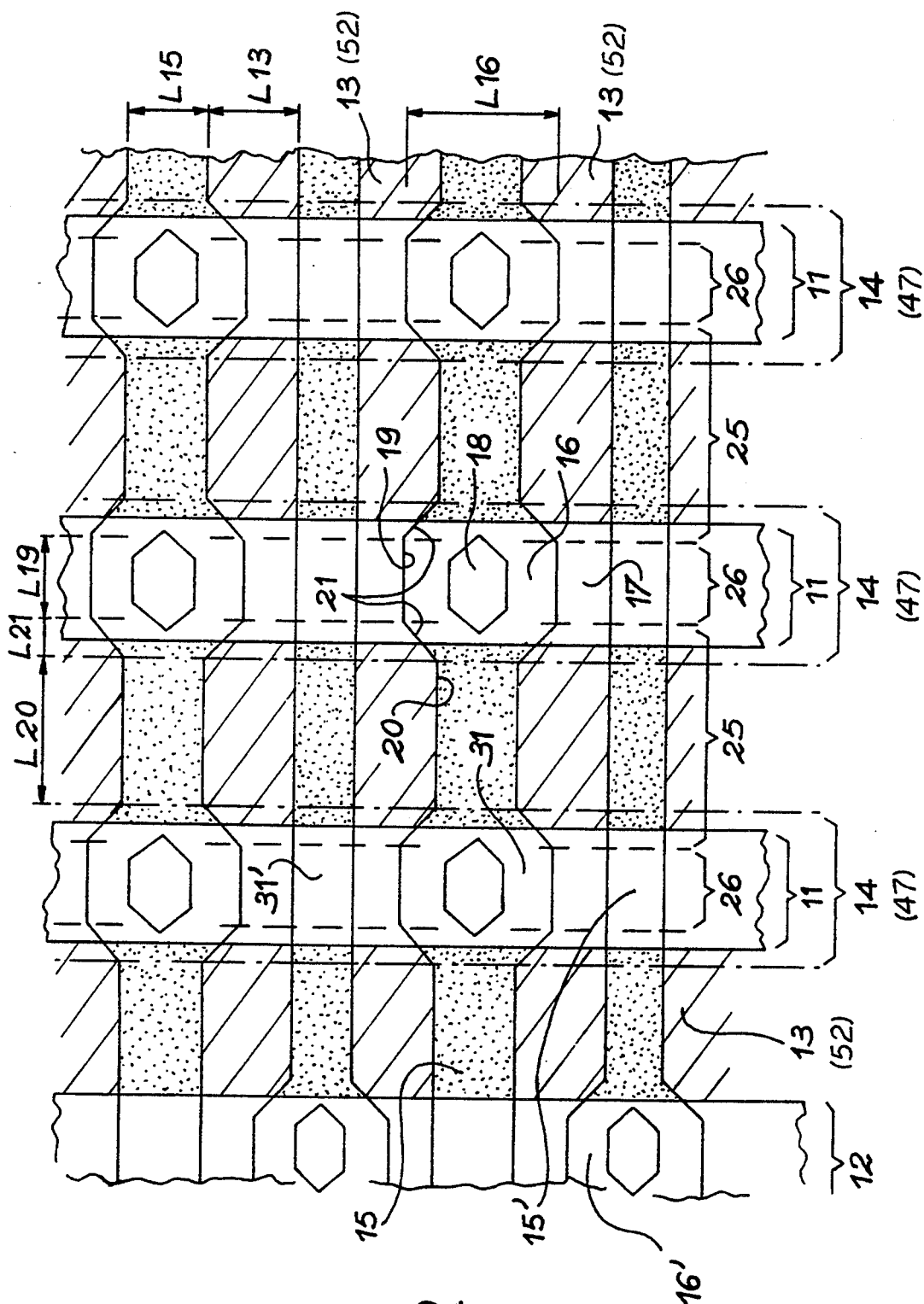
FIG. 2 is a partial top view of an EPROM type integrated circuit according to the invention.

FIG. 2 represents the general disposition of an EPROM memory according to the invention. The lines of electrical connections of the parallel binary and feed elements (11) and (12) extend over its upper surface. Perpendicular to these lines and separated from each other by an insulating material, conductive strips (13) extend under these lines and form the control gates.

Conductive zones (14) corresponding to the floating gates are situated under the strips of the control gates (13) and are partially situated under the lines of the binary elements (11) and above the channel zones (26), whereas the feed lines (12) extend between the conductive zones (14).

Insulating intervals (15 and 15') separate the conductive strips (13). They are fully filled with an insulating material, except in the openings, also called extensions, (16 and 16') which are disposed there at regular intervals inside 15 and 15'. The fully filled insulating intervals correspond to the narrowed parts, which are sometimes referred to a standing back parts, (17) of the adjacent conductive strips (13). The openings (16 and 16') are filled with an insulating material at their periphery, that is, at the contact of the conductive strips (13) and conductive zones (14), and filled at their center with a conductive material (18) joining the lines of connections (11 or 12) to the regions of drains and sources of the substrate. The insulating intervals (15) overlay the regions of drains of the substrate and are alternated with the insulating intervals (15') which overlay the regions of sources of the substrate. As seen in FIG. 2, the sources, generally situated between two control gates, are continuous, whereas the drains are separated by insulating material zones (25). By virtue of this disposition, it suffices to have an opening (16') above a source region periodically in an interval (15') and not systematically at each memory point. Furthermore, so as to increase integration density, each opening (16') preferably is disposed staggered with respect to the other opening (16).

In the embodiment represented, the narrowed parts (17) of the conductive strips (13) are delimited by the edges of the conductive strips (13) and more precisely by an internal wall segment (19) parallel to the external wall segment (20), which constitutes the limit of the intervals (15 and 15') outside the openings (16 and 16'), and by two connecting segments (21) joining the internal wall segment (19) to the external wall segment (20).

Figure 1A:
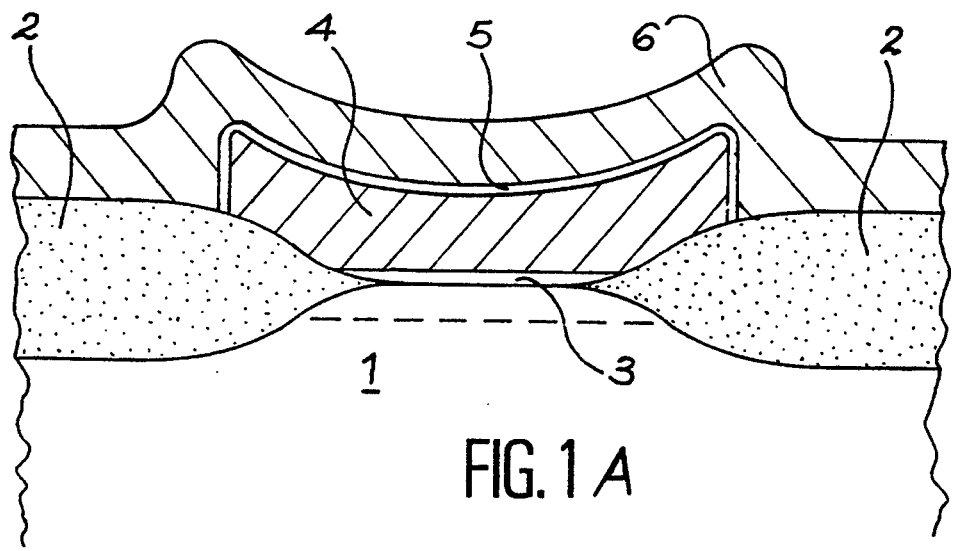
FIGS. 1A and 1B are partial views of an EPROM type integrated circuit according to the prior Art.
Figure 1B:
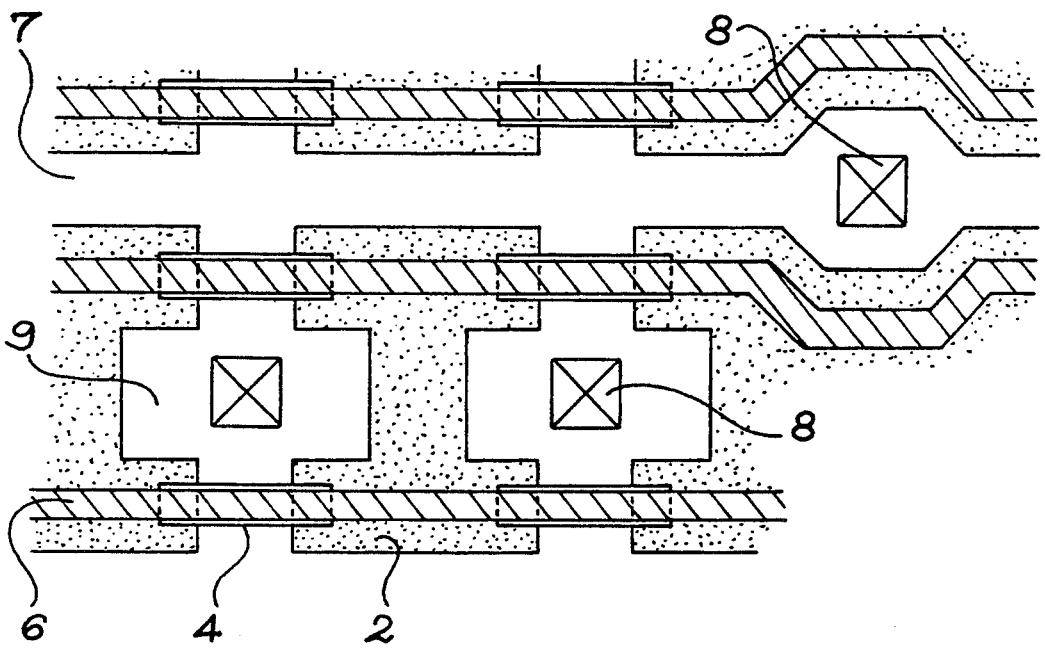
Figure 2A:
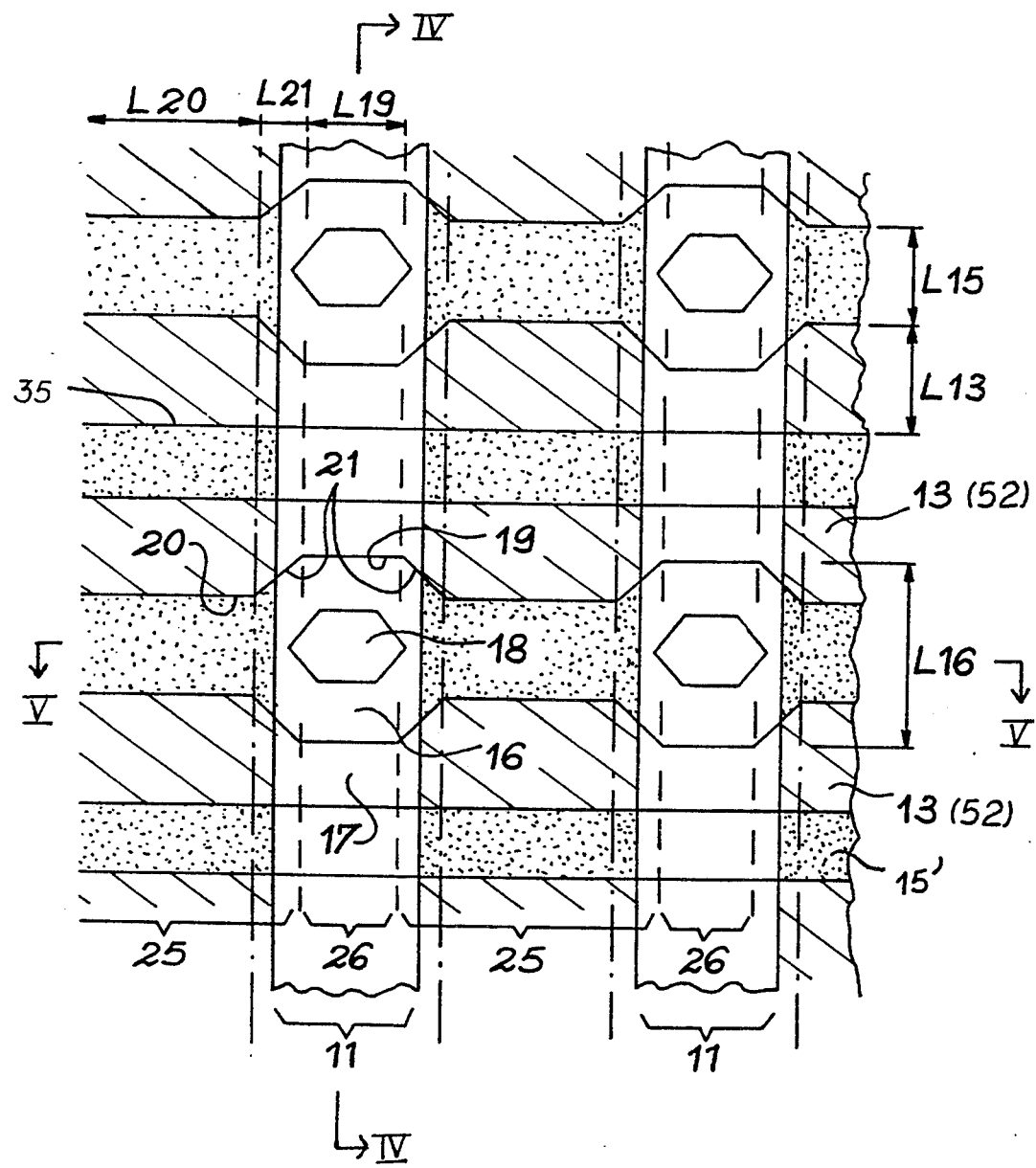
FIG. 2A is an enlarged view of the EPROM type integrated circuit depicted in FIG. 2, with sectional orientation lines IV—IV and V—V shown.

The width (L15) of the intervals (15 and 15') is, for example, 0.6 micrometer, except for the openings (16 and 16') where it is (L16) 1.4 micrometers; the maximum width (L13) of the conductive strips (13) is 1.0 micrometer; the length (L19) of the internal wall segments (19) is 0.6 micrometer, the length (L20) of the external wall segments (20) being 0.8 micrometer and the distance (L21) between the external wall segments (20) and the internal wall segments (19) being 0.3 micrometer. The narrowed parts (17) correspond to contractions of the conductive strips (13) to a width of 0.6 micrometer. Thus, an integrated circuit is obtained where a memory point takes up space on a rectangle 2 micrometers long and 1.6 micrometers wide, which constitutes a significant improvement compared with the prior Art where the surface of the memory points do not fall below between about 8 and 10 square micrometers. It should be noted that the FIGS. 1B, 2, and 2A are not on the same scale and that of the strips of the control gates (6 and 14) have essentially the same width in the two cases but are much closer in the invention. By means of the method to be described shortly, it can be observed that the conductive material zones (18) for connection between the connection lines (11 or 12) and the source and drain regions are essentially exactly at the center of the openings (16 and 16') and also their contour (hexagonal in this instance) is situated at an essentially invariable distance from the internal wall (19) and connecting segments (21) which constitute the edge of the opening (16 or 16') in which this contour is found. In other words, self-aligning of the contact zones is embodied in the openings (16 and 16').

Figure 3:
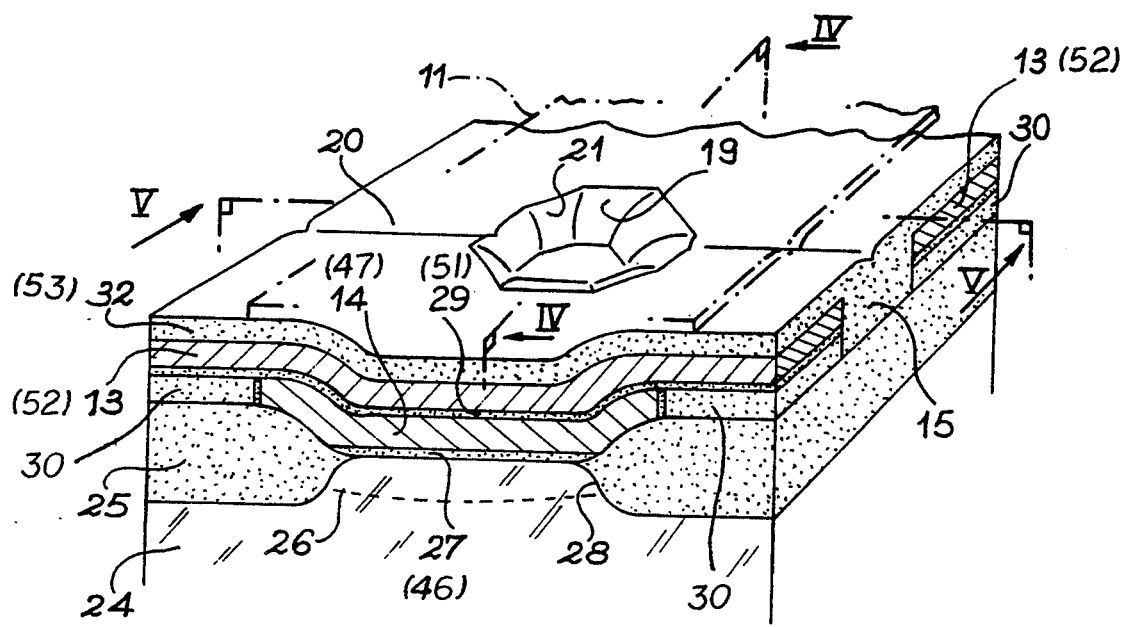
FIG. 3 is a perspective view of an elementary part of the integrated circuit of FIG. 2 and 2A exhibiting two sections.
Figure 4:
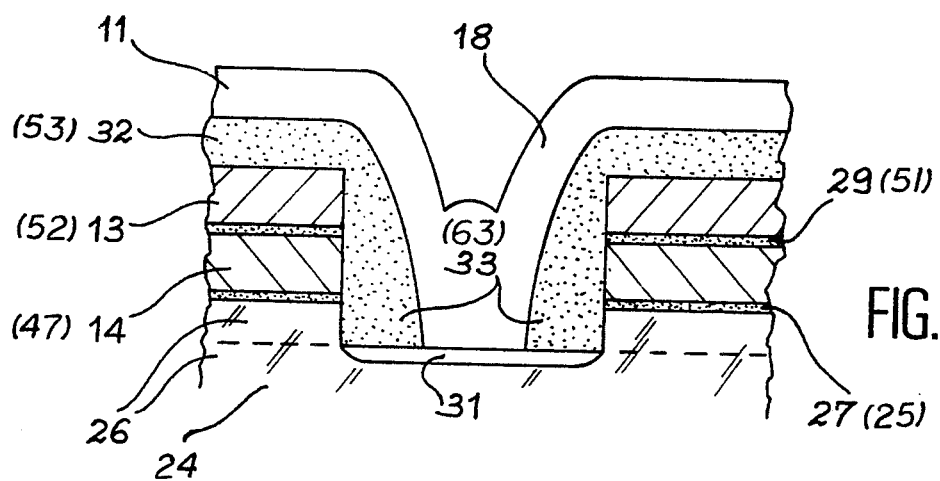
FIGS. 4 and 5 are two additional sections along the lines IV—IV and V—V of FIG. 3.
Figure 5:
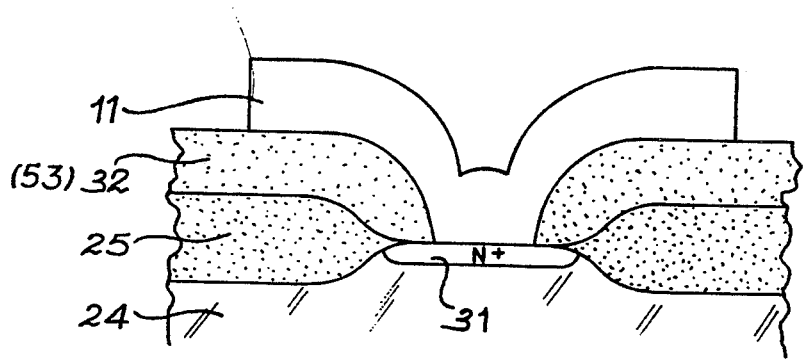

FIGS. 3 to 5 provide a more precise representation of the integrated circuit with an opening above a drain zone. It is possible to recognize the elements already mentioned, as well as the substrate (24) which, at its upper part, bears insulating strips, also referred to as field oxide regions, (25) parallel to the connection lines (11 or 12) and is periodically interrupted by the intervals (15'); the conductive channels (26) are on both sides of the field oxide insulating strips (25) and below the conductive zones (14) and the conductive zones (14) extend laterally slightly above the bevelled edges (28) of the insulating strips (25).

Intermediate insulating layers (29) separate the conductive zones (14) from the conductive strips (13). Insulating blocks (30) advantageously may be embodied between the insulating strips (25) and conductive strips (13) heightwise so as to improve the evenness of the assembly between the intervals (15 and 15') lengthwise and between the conductive zones (14) widthwise. The source regions (31') extend into the substrate (24) in the form of strips at the location of the intervals (15'), whereas the drain regions (31) are localized at the openings (16) of the intervals (15). Finally, an upper oxide layer (32) covers the conductive strips (13) and is connected to insulating flanks (33, FIG. 4) which fill the peripheral part of the extensions (16 and 16') and all the intervals (15 and 15').

Figure 6:
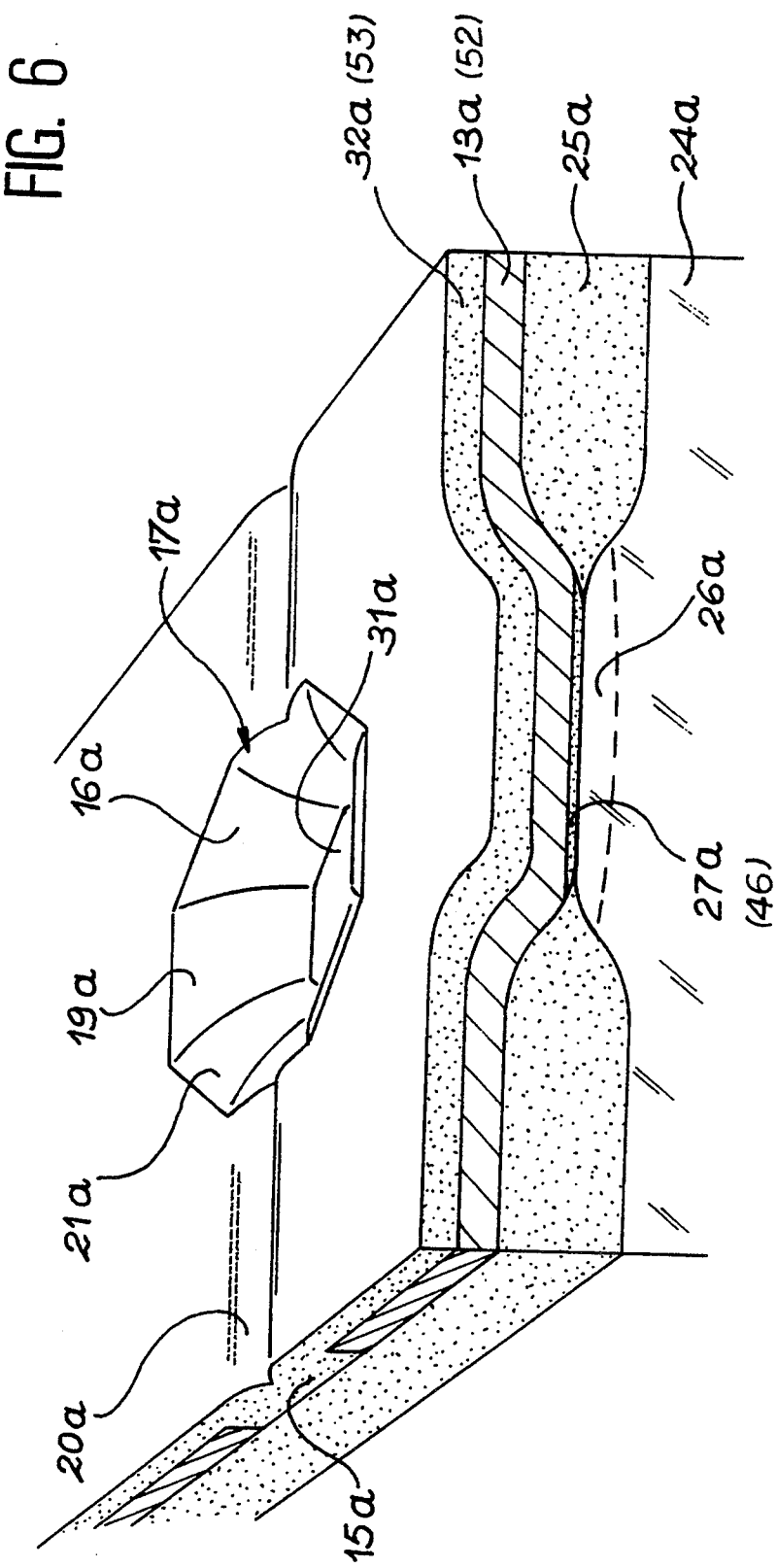
FIG. 6 shows a view similar to FIG. 3 of an elementary part of another integrated circuit according to the invention.
Figure 7:
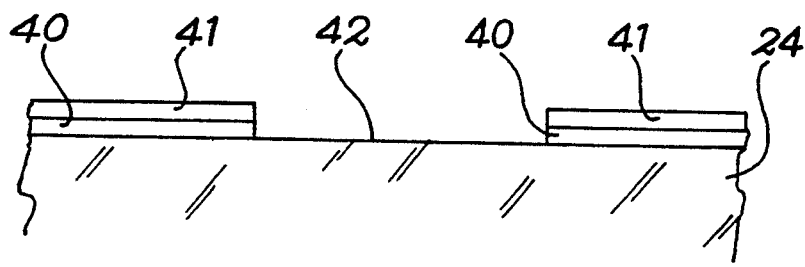
FIGS. 7, 8, 9A, 9B, and 10–14 show details of certain stages of the method for producing EPROM type integrated circuits of the invention.
Figure 8:
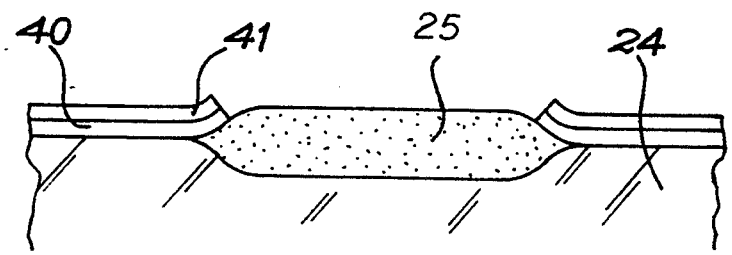
Figure 9:
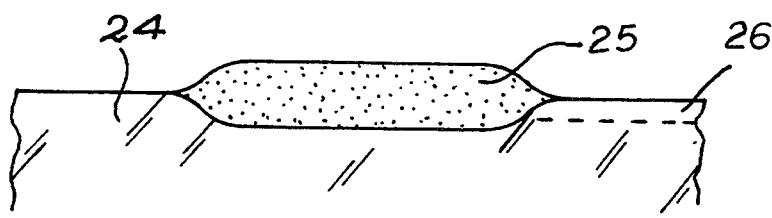
Figure 9:
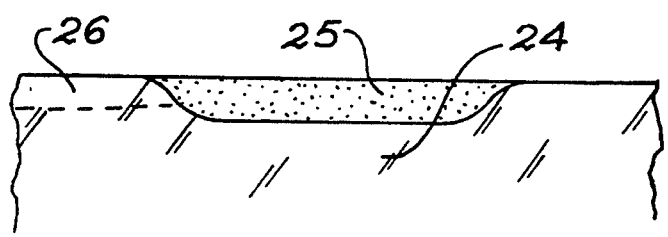

FIG. 6 represents another type of an integrated circuit according to the invention and which differs from the preceding one in that it does not contain any floating gates. The elements similar or analogous to those of the preceding circuit bear the same reference number to which added is the letter "a." A substrate (24a) is found comprising insulating strips (25a), channels (26a), source (not shown) or drain regions (31a), conductive strips (13a) parallel to the source or drain regions (31a) delimited by external (20a), internal (19a) and connecting (21a) segments and separated by intervals (15a) above the drain or source regions (31a). These intervals still have extensions (16a) between the narrowed parts (17a) of the conductive strips (13a). An upper oxide layer (32a) covers the conductive strips (13a) and fills up the intervals between the openings, as well as the peripheral part of the openings. Lines of electrical connections extend onto the upper oxide layer (32a) and into the openings. On the other hand, the conductive strips (13a) are only separated from the channels (26a) by insulating zones for overlapping the substrate (27a).

Referring now to FIGS. 7–14 wherein there is illustrated the method used to obtain a preferred embodiment of the invention, first, field oxide (25) is grown on an upper face of substrate (24). This is accomplished by first forming a mask made up of one layer, ten nanometers thick, of silicon oxide (40) covered by a layer, one hundred nanometers thick, of silicon nitride (41) and then subjecting the masked substrate to thermal oxidation. This causes a build-up of silicon dioxide (25) at the unmasked areas of the substrate (42). Thermal oxidation is halted when the thickness at the center of the silicon dioxide build-up (43) reaches seven hundred nanometers. The mask, composed of the silicon oxide layer (40) covered by the silicon nitride layer (41), is removed chemically. If planarization of the integrated circuit's surface is desired at this point, then it is possible to planarize the surface by applying, for example, a photoresist resin to the surface of the device and then etching the surface with a plasma. If such a planarization is carried out, the device depicted in FIG. 9B is obtained, otherwise the device depicted in FIG. 9A is obtained. Note the locations, in FIG. 9A and FIG. 9B, of the as yet unformed source-drain channel regions (26).

Continuing the description of the process using the unplanarized device, depicted in FIG. 9A or 9B, a layer of silicon oxide (46), constituting the gate oxide, next is formed by thermally oxidizing the substrate (24) located between the field oxide regions (25). Boron ions are implanted in source-drain channel regions (26) to define the device's voltage threshold level. A conductive layer of polycrystalline silicon (45), of about two hundred to about three hundred nanometers thick, is then chemically deposited by low-pressure vapor-phase deposition, in known manner, at a temperature of 615° C. This is followed by phosphorus (n—) doping of the device in an oven at 900° C. in an atmosphere of POCl. A resin mask (56), used to form the floating gates (47), is deposited and centered with respect to the field oxide regions (25). A reactive plasma anisotropic etching then removes the layer of polycrystalline silicon (45) in the areas which were not covered by the resin mask (56). The resin mask (56) is then destroyed chemically leaving the floating gates (47), located over the source-drain channels and the gate oxide layers. An insulating layer (47') is created by thermally oxidizing the floating gates (47), in order to protect them.

An oxide layer (48) is deposited so as to cover the floating gates (47), the protective insulating layer (47'), and the spaces in between the floating gates. The oxide layer (48) is anisotropically plasma etched until the upper surfaces of the floating gates are exposed. The upper surface of the oxide layer (50) is then planar and flat in the areas in between the floating gates (47). A thin triple layer (51), composed of silicon dioxide, silicon nitride, and silicon dioxide, is created on the surface of the device by thermally oxidizing the device's surface, doping the newly formed silicon dioxide with nitride or depositing silicon nitride directly, and then thermally oxidizing the device's surface again.

A second polycrystalline silicon conductive layer (52) is deposited by the same method by which the first polycrystalline silicon conductive layer (45) was deposited. An upper oxide layer (53) is chemically vapor-phase deposited by means of tetraethoxysilane decomposition. A photoresist mask (55) is deposited onto the surface of the device. This mask is used in the etching of the upper oxide layer (53), the second polycrystalline silicon layer (52), the insulating layer directly above the floating gates (51), and the floating gates (47) perpendicular to the surface of the device.

The resin mask (55) is then covered with an upper resin mask (54). This upper resin mask (54) is only opening in the insulating intervals 15' on the source side. The device is then etched and the parts of the device which are not covered by the upper resin mask are removed as far down as the substrate (24). In this etching, the field oxide (25) and gate oxide (46) are removed.

The source and drain regions are created next by implanting arsenic ions in the drain and source regions, 15 and 15'. An oxide layer (60), two thousand to three thousand nanometers in thickness, then is deposited. The most suitable oxides for this deposit include tetraethoxysilane or silicon dioxide doped with a composition of boron and phosphorus. The drawing in FIG. 14 distinguishes among three parts of the oxide layer (60): the upper part of the deposit (61) located on the surface of the device, the bottom part of the deposit (62) located at the bottom of the contact openings and which cover the source and drain regions, and the sidewall deposits (63) which cover the sidewalls of the contact openings.

The oxide layer (60) is then etched in accordance with the present invention. An anisotropic plasma etching, without masks or photolithography, is used to totally remove the bottom part of the oxide deposit (62) while only partially removing the sidewall deposits (63) and totally removing the upper part of the deposit (61). This results in a sidewall deposit contour (64). Only the electrical connection lines remain to be installed in order for the process to be complete and the device to look like the ones depicted in FIGS. 3 to 5.

Thereafter, a metal, such as aluminum or tungsten, is deposited over the surface of the device so as essentially completely to fill in the contact openings and to cover the upper oxide layer (53). A resist mask is then used to cover the places on the surface of the device where electrical connection lines are desired. Plasma etching is then used to remove all of the uncovered metal; this creates the electrical connection lines. The resin mask then is chemically removed.

Figure 10:
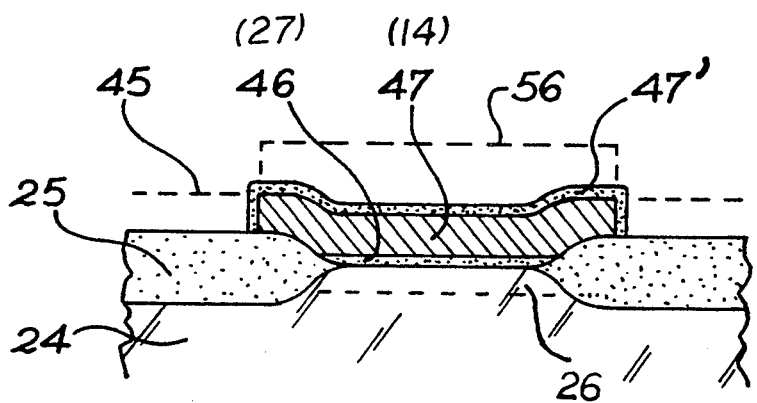
Figure 11:
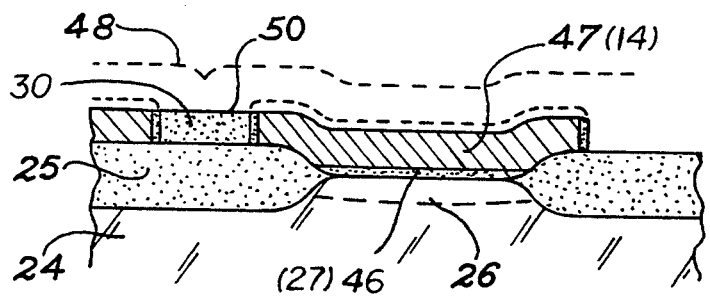
Figure 12:
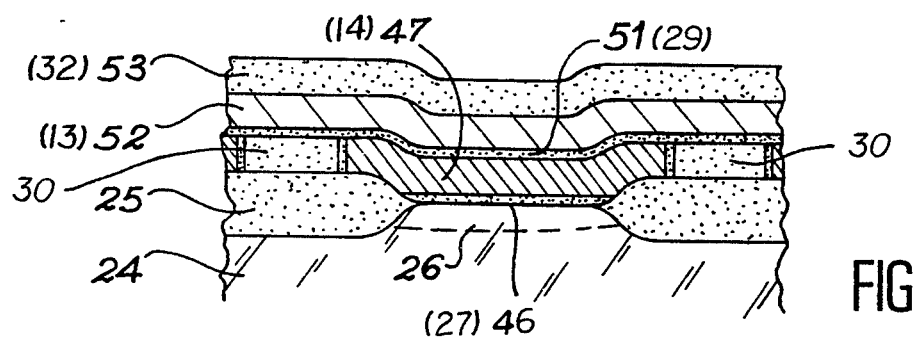
Figure 13:
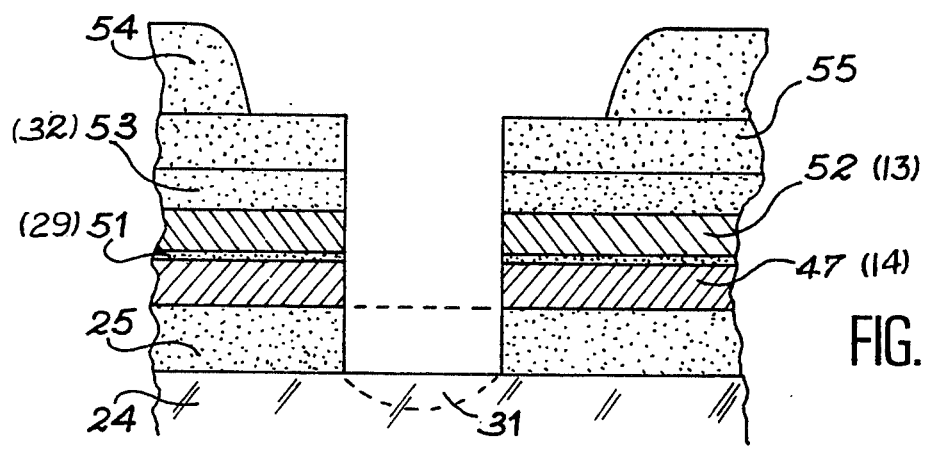
Figure 14:
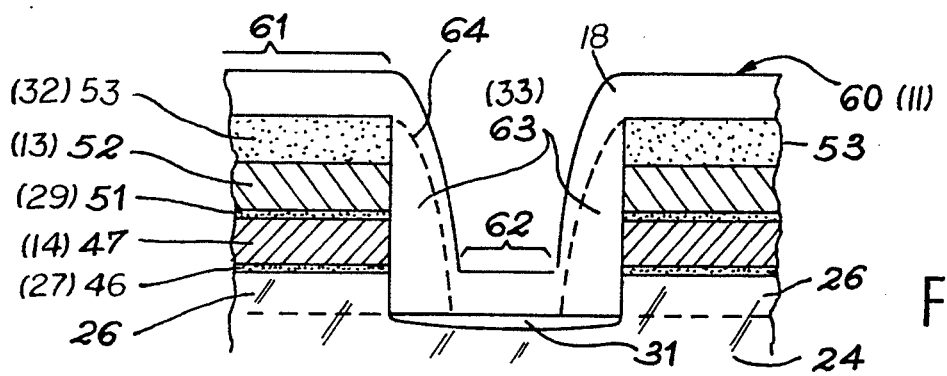

Another embodiment of the invention is illustrated in FIG. 6, in which, however, an integrated circuit is formed without floating gates. Thus, the stages depicted in FIGS. 10 and 11 are not achieved since the device is not meant to have floating gates. The overall method is similar to the method above-described in detail except that after having formed the field oxide regions (25), an insulating layer of gate oxide (46) is formed, a polycrystalline silicon layer (52) is deposited, and an upper oxide layer (53) is deposited. The remainder of the above-described method is then applied, after which, the device is further processed in accordance with the present invention.

The materials used in the above preferred embodiments of the invention should not be considered restrictively but rather should be considered to be only engineering choices. Generally, while the preferred embodiments of the method, process, and apparatus of the invention have been disclosed with reference to specific semiconductor memory structures and processes, it is to be understood that many changes in detail may be made as a matter of engineering choices without departing from the spirit and scope of the invention, as defined by the hereinafter appended claims.

What is claimed is:

1. A method for producing an integrated circuit comprising the steps in sequence of:
   a. providing a semiconductor substrate and defining active areas by establishing outside these active areas insulating zones of field oxide in an upper face of a semiconductor substrate;
   b. forming a first insulating layer on the upper surface of the substrate;
   c. depositing a conductive layer;
   d. depositing a second insulating layer on the conductive layer;
   e. patterning the second insulating layer and the conductive layer down to the first insulating layer so as to create conductive strips having reduced areas, said strips being separated by intervals having enlarged parts at locations corresponding to said reduced areas, these conductive strips forming control gates of the circuit;
   f. creating source and drain regions in the active areas in said intervals;
   g. depositing a third insulating layer to completely cover the structure produced at step (f) and completely refill the intervals outside the enlarged parts;
   h. masklessly anisotropically etching the third insulating layer and the first insulating layer down to the substrate to create contact openings in the enlarged parts of the intervals but leaving unaffected the refilling of the intervals by the third insulating layer outside the enlarged parts, the second insulating layer still covering the circuit outside the contact openings; and
   i. forming electrical connection lines extending into the contact openings.

2. A method according to claim 1, and further including the steps after step b of:
   a. depositing a lower conductive layer on the first insulating layer;

b. etching the lower conductive layer above the insulating zones; and c. forming an intermediate insulating layer above the etched lower conductive layer, the lower conductive layer and the intermediate insulating then being etched at step e together with the conductive layer deposited in step c and the second insulating layer, the etched lower conductive layer creating floating gates of the nonvolatile memory.

3. A method according to claim 1, wherein the substrate is made of silicon, and the insulting zones are formed by a localized thermal oxidation of the substrate between the active areas protected by a mask.

4. A method according to claim 1, and further including the step of doping the substrate between the insulating zones.

5. A method according to claim 1, wherein the electrical connections are formed by deposition and etching of a metallic layer.

6. A method according to claim 1, and further including the step of planarizing of the insulating zones.

7. A method according to claim 1, wherein the insulating zones are patterned in strip-form at step a, then etched after step e down to the substrate in the active areas corresponding to the sources created at subsequent step f.

8. A method according to claim 2, and further including the steps after etching the lower conductive layer, of depositing of a fourth insulating layer and etching back this fourth insulating layer down to the lower conductive layer, before depositing the intermediate insulating layer.

* * * * *